(12) United States Patent
Yang et al.

(10) Patent No.: US 9,144,177 B2
(45) Date of Patent: Sep. 22, 2015

(54) HEAT DISSIPATION APPARATUS

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Chih-Hao Yang, New Taipei (TW); Xiang-Kun Zeng, Shenzhen (CN); Bao-Quan Shi, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 269 days.

(21) Appl. No.: 13/928,360

(22) Filed: Jun. 26, 2013

(65) Prior Publication Data

US 2014/0146470 A1 May 29, 2014

(30) Foreign Application Priority Data

Nov. 23, 2012 (CN) .......................... 2012 1 04807171

(51) Int. Cl.
 *H05K 7/20* (2006.01)
 *F28F 5/00* (2006.01)
 *H02K 33/18* (2006.01)
 *G06F 1/20* (2006.01)

(52) U.S. Cl.
 CPC .............. *H05K 7/20136* (2013.01); *F28F 5/00* (2013.01); *G06F 1/203* (2013.01); *H02K 33/18* (2013.01)

(58) Field of Classification Search
 CPC .......... H05K 7/20136; H05K 7/20145; H05K 7/20154; H05K 7/2039; F04F 33/00; F28F 5/00; H02K 33/06; H02K 33/16; H02K 33/18
 See application file for complete search history.

(56) References Cited

U.S. PATENT DOCUMENTS

2008/0286133 A1\* 11/2008 He et al. ......................... 417/415
2014/0338881 A1\* 11/2014 Yang et al. ..................... 165/200

\* cited by examiner

*Primary Examiner* — Robert J Hoffberg
(74) *Attorney, Agent, or Firm* — Novak Druce Connolly Bove + Quigg LLP

(57) ABSTRACT

A heat dissipation apparatus for effective dissipation of heat comprises an air flow module and a heat sink. The air flow module comprises a casing, a piston module slidably mounted in the casing, an airflow outlet module attached to a first side of the casing, and an electromagnet module attached to a second side of the casing that is opposite to the first side. The airflow outlet module comprises a plurality of airflow outlet grooves. The piston module comprises a magnet. The heat sink is aligned with the plurality of airflow outlet grooves. The electromagnet module is capable of moving the magnet and the piston module back and forth in the casing. The air flow module is capable of blowing air to the heat sink via the plurality of airflow outlet grooves.

20 Claims, 5 Drawing Sheets

HEAT DISSIPATION APPARATUS

BACKGROUND

1. Technical Field

The present disclosure relates to a heat dissipation apparatus.

2. Description of Related Art

A heat dissipation apparatus is mounted on a motherboard of an electronic device, such as a computer, for dissipating heat generated by electronic components in the electronic device. Generally, the heat dissipation apparatus comprises a heat sink and a fan. The heat sink is mounted on one of the electronic components (such as a processor) and comprises a plurality of fins. The fan is mounted on the heat sink. However, the heat dissipation apparatus takes up a lot of space and is not practical for thin, flat computers such as tablet personal computers.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
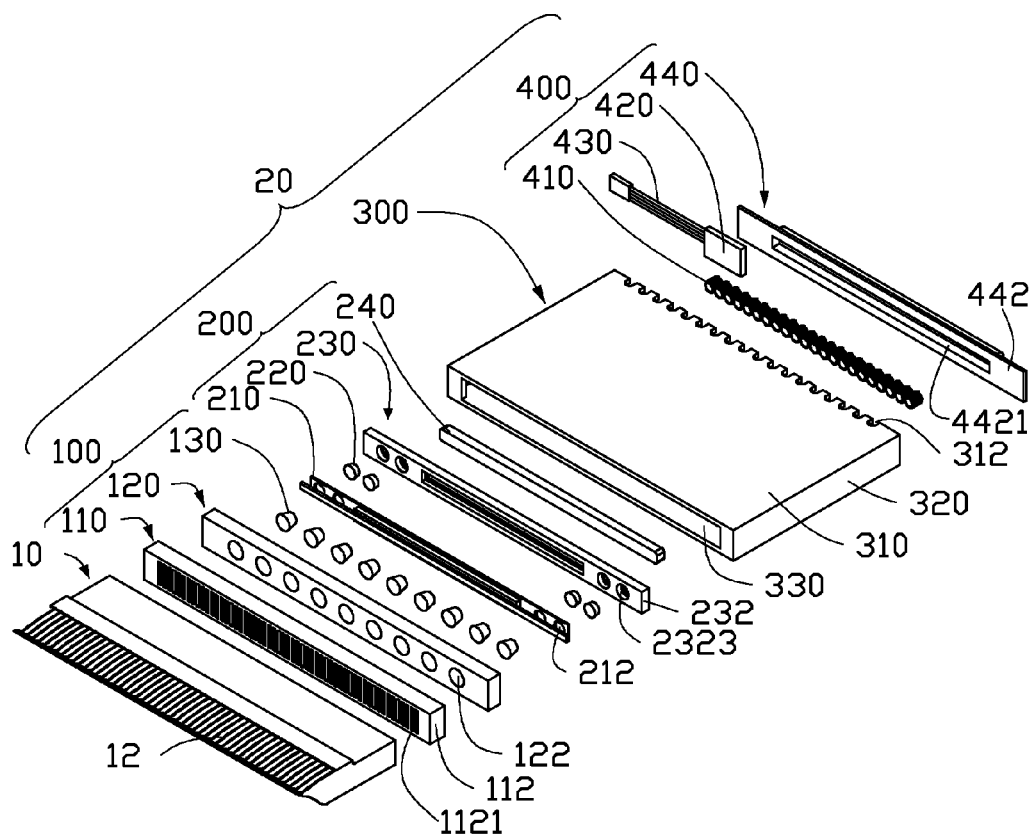
FIG. 1 is an isometric, exploded view of an embodiment of a heat dissipation apparatus.
Figure 2:
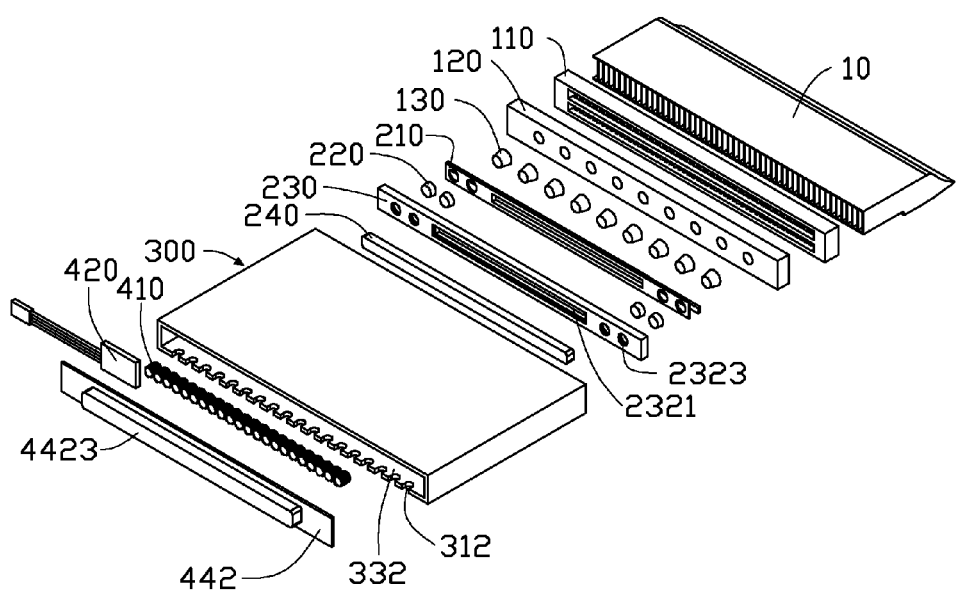
FIG. 2 is similar to FIG. 1, but viewed from another aspect.

FIGS. 1 and 2 show an embodiment of a heat dissipation apparatus comprising a heat sink 10 and an air flow module 20. The heat sink 10 comprises a plurality of fins 12 parallel to each other. The air flow module 20 comprises an airflow outlet module 100, a piston module 200, a casing 300, and an electromagnet module 400.

The airflow outlet module 100 comprises an airflow outlet member 110, a covering member 120, and a plurality of first rubber valves 130. The airflow outlet member 110 includes a rectangular main body 112 and a plurality of airflow outlet grooves 1121 defined in the rectangular main body 112. A plurality of first mounting holes 122 is defined in the covering member 120 corresponding to the plurality of first rubber valves 130.

The piston module 200 comprises a sealing member 210, two pairs of second rubber valves 220, a piston member 230, and a magnet 240. Two pairs of second mounting holes 212 are defined in the sealing member 210 corresponding to the two pairs of second rubber valves 220. The piston member 230 comprises a piston main body 232. A mounting groove 2321 is defined in the piston main body 232. Two pairs of third mounting holes 2323 are defined in the piston main body 232. The mounting groove 2321 is located between the two pairs of third mounting holes 2323.

The casing 300 is hollow and has a rectangular shape. The casing 300 comprises a pair of side plates 310 parallel to each other and a pair of side walls 320 substantially perpendicularly connected between the pair of side plates 310. The casing 300 comprises a front opening 330 and a rear opening 332 opposite to the front opening 330. A distance between the pair of side walls 320 is substantially equal to a length of the piston member 230. A distance between the pair of side plates 310 is substantially equal to a height of the piston member 230. A plurality of airflow inlet gaps 312 is defined in one of the pair of side plates 310 and located adjacent to the rear opening 332.

The electromagnet module 400 comprises a plurality of electromagnets 410. Each of the electromagnets 410 comprises an iron core and a coil of wire wrapped around the iron core. The direction of the magnetic field generated by the electromagnets 410 is related to a direction of current flowing through the coil of wire. The electromagnet module 400 further comprises a circuit board 420 and a plurality of cables 430 connected to the circuit board 420. The circuit board 420 controls current flowing through each of the electromagnets 410, thereby controlling the magnetic field generated by them. The electromagnet module 400 further comprises a holder 440 for holding the electromagnets 410. The holder 440 comprises a main plate 442 and an opening 4421 defined in the main plate 442. A holding portion 4423 protrudes substantially perpendicularly from the edge of the opening 4421. The electromagnets 410 are placed in the opening 4421 and held by the holding portion 4423.

Figure 3:
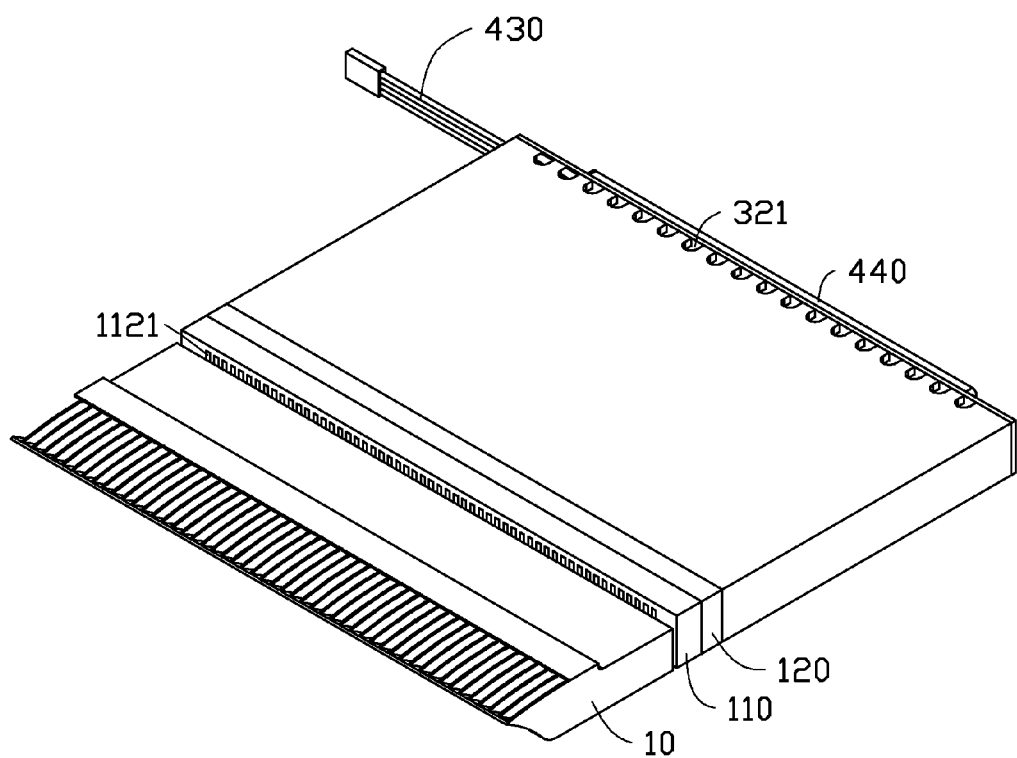
FIG. 3 is an assembled view of the heat dissipation apparatus of FIG. 1.
Figure 4:
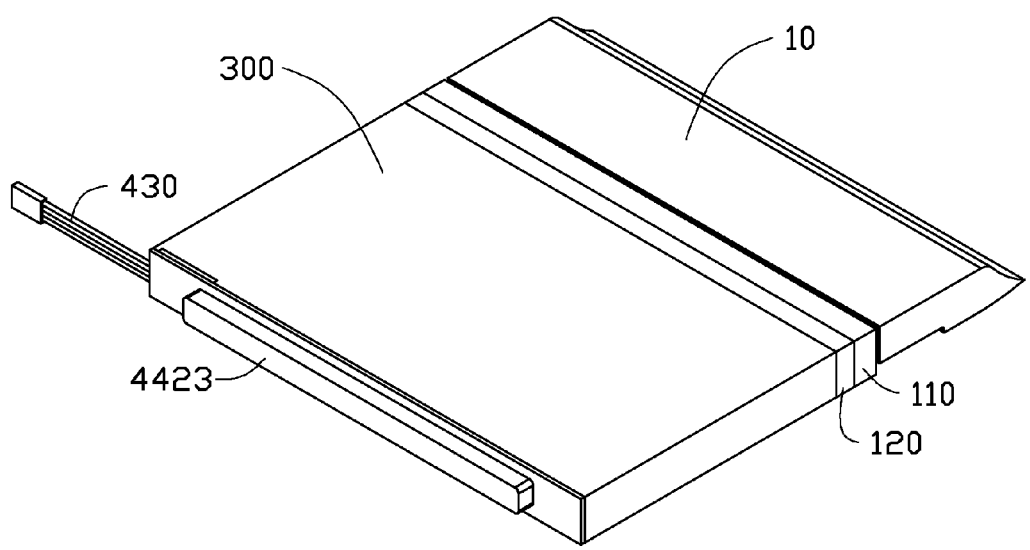
FIG. 4 is an assembled view of the heat dissipation apparatus of FIG. 2.
Figure 5:
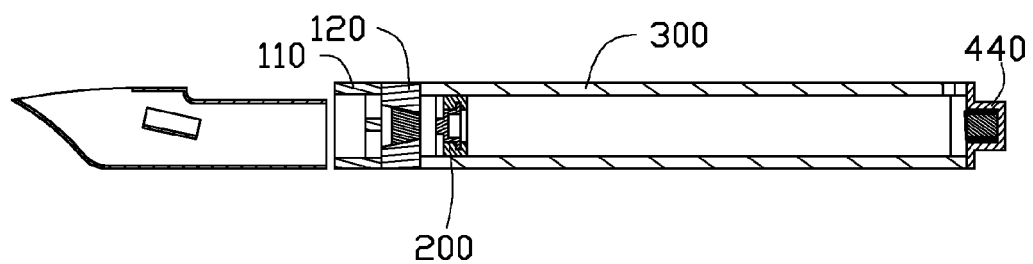
FIG. 5 is a cross-sectional view of the heat dissipation apparatus of FIG. 3.

FIGS. 3 and 5 show in assembly, the circuit board 420 is mounted between the holder 440 and the rear opening 332. The electromagnets 410 are mounted in the holder 440. The main plate 442 is attached to the casing 300 and seals the rear opening 332. The two pairs of second rubber valves 220 are mounted in the two pairs of third mounting holes 2323. The magnet 240 is mounted in the mounting groove 2321. The two pairs of second mounting holes 212 are aligned with the two pairs of second rubber valves 220. The sealing member 210 is attached to the piston member 230 to seal the mounting groove 2321. The piston module 200 is assembled and mounted in the casing 300. The piston member 230 abuts against the pair of side plates 310 and the pair of side walls 320 and is slid into the casing 300. The first rubber valves 130 are mounted in the first mounting holes 122. The covering member 120 is attached to the casing 300 and closes the front opening 330. The airflow outlet member 110 is mounted on a front side of the covering member 120. The heat sink 10 is mounted on a front side of the airflow outlet member 110.

In operation, the piston module's 200 starting position is abutting against the electromagnet module 400, the first rubber valves 130 are closed, and the second rubber valves 220 are open. The electromagnets 410 generate a magnetic field with a first direction to push the magnet 240 and the piston module 200 toward the front opening 330. The first rubber valves 130 open and allow air to flow through the first mounting holes 122. The two pairs of second rubber valves 220 close in order to seal the two pairs of third mounting holes 2323, allowing the piston module 200 to push air out from the front opening 330 to the airflow outlet module 100. The airflow outlet module 100 blows the air to the heat sink 10 via the plurality of first mounting holes 122 and the plurality of airflow outlet grooves 1121.

When the piston module 200 moves to the front opening 330 and abuts against the airflow outlet module 100, the circuit board 420 switches the direction of current flowing through the plurality of electromagnets 410 causing the magnetic field generated by each of the electromagnets 410 to have a second direction opposite to the first direction and the air flow module 20 to switch to an air intake mode. The electromagnets 410 draw the magnet 240 and the piston module 200 to the rear opening 332. The plurality of first rubber valves 130 closes to seal the plurality of first mounting holes 122, and the two pairs of second rubber valves 220 open, causing air to flow into the casing 300 via the plurality of airflow inlet gaps 312. When the piston module 200 moves to the rear opening 332 and abuts against the electromagnet module 400, the electromagnets push the piston module 200 back to the front opening 330. In the above manner, the air flow module 20 can blow air to the heat sink 10 and draw air into the casing 300, accelerating the heat dissipation rate of the heat dissipation apparatus.

In one embodiment, a sensor is mounted on the circuit board 420 to sense a position of the piston module 200. The circuit board 420 can switch the direction of current flowing through the electromagnet 410 according to the position of the piston module 200. In another embodiment, the circuit board 420 can switch the direction of current flowing through the electromagnet 410 according to a predetermined time sequence. Thus, the electromagnetic field direction is switched periodically to urge the piston module 200 repeatedly moving back and forth in the casing 300.

The heat sink 10 and the air flow module 20 are arranged side by side. A thickness of the heat dissipation module is much less than a width or length of the heat dissipation module. The heat dissipation module is suitable to be used in a thin, flat computer such as a tablet personal computer.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A heat dissipation apparatus comprising:
   an air flow module comprising a casing, a piston module slidably mounted in the casing, an airflow outlet module attached to a first side of the casing, and an electromagnet module attached to a second side of the casing that is opposite to the first side; the airflow outlet module comprising a plurality of airflow outlet grooves; and the piston module comprising a magnet; and
   a heat sink aligned with the plurality of airflow outlet grooves;
   wherein the electromagnet module is capable of generating magnetic field to push the magnet and the piston module, to slide between the airflow outlet module and the electromagnet module; and the air flow module is capable of blowing airflow to the heat sink, via the plurality of airflow outlet grooves.

2. The heat dissipation apparatus of claim 1, wherein the casing comprises a plurality of airflow inlet gaps, when the piston module is sliding towards the airflow outlet module, the air flow module is capable of blowing airflow to the heat sink via the plurality of airflow outlet grooves; and when the piston module is sliding towards the electromagnet module, the air flow module is capable of drawing airflow into the casing via the plurality of airflow inlet gaps.

3. The heat dissipation apparatus of claim 2, wherein the airflow outlet module comprises an airflow outlet member, a covering member, and a plurality of first rubber valves; a plurality of first mounting holes is defined in the covering member for mounting the plurality of first rubber valves; and the plurality of airflow outlet grooves is defined in the airflow outlet member.

4. The heat dissipation apparatus of claim 3, wherein the covering member is attached to the first side of the casing and abuts the airflow outlet member, the plurality of first rubber valves is open when the piston module is sliding towards the airflow outlet module; and the plurality of first rubber valves is closed when the piston module is sliding towards the electromagnet module.

5. The heat dissipation apparatus of claim 4, wherein the piston module further comprises a plurality of second rubber valves and a piston member, a plurality of holes is defined in the piston member for mounting the plurality of second rubber valves; the plurality of second rubber valves is closed when the piston module is sliding towards the airflow outlet module; and the plurality of second rubber valves is open when the piston module is sliding towards the electromagnet module.

6. The heat dissipation apparatus of claim 5, wherein the magnet is attached to the piston member.

7. The heat dissipation apparatus of claim 6, wherein the casing is hollow and comprises a pair of side plates parallel to each other and a pair of side walls substantially perpendicularly connected between the pair of side plates, and the plurality of airflow inlet gaps is defined in one of the pair of side plates and located at the second side of the casing.

8. The heat dissipation apparatus of claim 7, wherein a distance between the pair of side walls is substantially equal to a length of the piston member, a distance between the pair of side plates is substantially equal to a width of the piston member.

9. The heat dissipation apparatus of claim 1, wherein the electromagnet module comprises a plurality of electromagnets and a circuit board configured to control current flowing through each of the plurality of electromagnets.

10. The heat dissipation apparatus of claim 9, wherein the electromagnet module further comprises a holder attached to the second side of the casing, the holder comprises a main plate and an opening defined in the main plate, and a holding portion protrudes substantially perpendicularly from a periphery edge of the opening for holding the plurality of electromagnets.

11. A heat dissipation apparatus comprising:
   an air flow module comprising a casing, a piston module slidably mounted in the casing, an airflow outlet module attached to a first side of the casing, and an electromagnet module attached to a second side of the casing that is opposite to the first side; the airflow outlet module comprising a plurality of airflow outlet grooves; the casing comprises a plurality of airflow inlet gaps; and the piston module comprising a magnet; and
   a heat sink aligned with the plurality of airflow outlet grooves;
   wherein the electromagnet module is capable of generating magnetic field to push the magnet and the piston module, to slide between the airflow outlet module and the electromagnet module, the air flow module is capable of blowing airflow to the heat sink via the plurality of airflow outlet grooves when the piston module is sliding towards the airflow outlet module, and the air flow module is capable of drawing airflow into the casing via the plurality of airflow inlet gaps.

12. The heat dissipation apparatus of claim 11, wherein the airflow outlet module comprises an airflow outlet member, a covering member, and a plurality of first rubber valves; a plurality of first mounting holes is defined in the covering member for mounting the plurality of first rubber valves; and the plurality of airflow outlet grooves is defined in the airflow outlet member.

13. The heat dissipation apparatus of claim 12, wherein the covering member is attached to the first side of the casing and abuts the airflow outlet member, the plurality of first rubber valves is open when the piston module is sliding towards the airflow outlet module; and the plurality of first rubber valves is closed when the piston module is sliding towards the electromagnet module.

14. The heat dissipation apparatus of claim 13, wherein the piston module further comprises a plurality of second rubber valves and a piston member, a plurality of holes is defined in the piston member for mounting the plurality of second rubber valves; the plurality of second rubber valves is closed when the piston module is sliding towards the airflow outlet module; and the plurality of second rubber valves is open when the piston module is sliding towards the electromagnet module.

15. The heat dissipation apparatus of claim 14, wherein the magnet is attached to the piston member.

16. The heat dissipation apparatus of claim 14, wherein the piston module further comprises a sealing member attached to the piston member for sealing the piston member.

17. The heat dissipation apparatus of claim 14, wherein the casing is hollow and comprises a pair of side plates parallel to each other and a pair of side walls substantially perpendicularly connected between the pair of side plates, and the plurality of airflow inlet gaps is defined in one of the pair of side plates and located at the second side of the casing.

18. The heat dissipation apparatus of claim 17, wherein a distance between the pair of side walls is substantially equal to a length of the piston member, a distance between the pair of side plates is substantially equal to a width of the piston member.

19. The heat dissipation apparatus of claim 11, wherein the electromagnet module comprises a plurality of electromagnets and a circuit board configured to control current flowing through each of the plurality of electromagnets.

20. The heat dissipation apparatus of claim 19, wherein the electromagnet module further comprises a holder attached to the second side of the casing, the holder comprises a main plate and an opening defined in the main plate, and a holding portion protrudes substantially perpendicularly from a periphery edge of the opening for holding the plurality of electromagnets.

* * * * *